United States Patent
Rush et al.

(10) Patent No.: US 11,112,839 B2
(45) Date of Patent: Sep. 7, 2021

(54) ADDITIVELY MANUFACTURED COOLING ASSEMBLIES FOR THERMAL AND/OR MECHANICAL SYSTEMS, AND METHODS FOR MANUFACTURING THE ASSEMBLIES

(71) Applicant: General Electric Company, Schenectady, NY (US)

(72) Inventors: Brian Magann Rush, Niskayuna, NY (US); Corey Bourassa, Mechanicville, NY (US); William Dwight Gerstler, Niskayuna, NY (US); Gary Mandrusiak, San Diego, CA (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 39 days.

(21) Appl. No.: 16/271,220

(22) Filed: Feb. 8, 2019

(65) Prior Publication Data
US 2020/0103947 A1      Apr. 2, 2020

Related U.S. Application Data

(60) Provisional application No. 62/739,688, filed on Oct. 1, 2018.

(51) Int. Cl.
*G06F 1/20* (2006.01)
*H05K 7/20* (2006.01)

(52) U.S. Cl.
CPC ........... *G06F 1/20* (2013.01); *H05K 7/20327* (2013.01); *H05K 7/20336* (2013.01); *G06F 2200/201* (2013.01)

(58) Field of Classification Search
CPC . G06F 1/20; G06F 2200/201; H05K 7/20327; H05K 7/20336
See application file for complete search history.

(56) References Cited

U.S. PATENT DOCUMENTS 5,587,880 A * 12/1996 Phillips ............... F28D 15/0266
                                                165/104.29
6,900,990 B2 * 5/2005 Tomioka ................. G06F 1/203
                                                174/15.1
(Continued)

FOREIGN PATENT DOCUMENTS

DE         202015101039 U1     5/2015

OTHER PUBLICATIONS

Extended European Search Report issued in corresponding European Application No. 19200941.3, dated Feb. 26, 2020.

*Primary Examiner* — Gordon A Jones
(74) *Attorney, Agent, or Firm* — Venable LLP; Jacqueline A. DiRamio; Michele V. Frank (57) ABSTRACT

A multi-domain cooling assembly configured to be coupled with one or more heat sources includes a body having an outer surface and at least one cooling chamber disposed inside the body. The at least one cooling chamber extends in at least two orthogonal dimensions and includes a working fluid to extract thermal energy from the one or more heat sources. The assembly includes a cooling channel disposed within the body and fluidly coupled with a passageway that carries cooling fluid into and out of the cooling channel. At least a portion of the cooling fluid is a liquid phase, a gas phase, or a liquid-gas mix phase. The cooling channel is fluidly separate from the at least one cooling chamber. The cooling channel is thermally coupled with the at least one cooling chamber. The at least one cooling chamber transfers thermal energy from the working fluid to the cooling fluid.

19 Claims, 8 Drawing Sheets

(56) References Cited

U.S. PATENT DOCUMENTS

| | | | |
|---|---|---|---|
| 10,327,355 B2* | 6/2019 | Lin | H05K 7/1492 |
| 2004/0070940 A1* | 4/2004 | Tomioka | G06F 1/203 |
| | | | 361/699 |
| 2006/0144565 A1* | 7/2006 | Tsai | F28D 15/0233 |
| | | | 165/104.26 |
| 2006/0262505 A1* | 11/2006 | Cheng | G06F 1/20 |
| | | | 361/700 |
| 2007/0056713 A1* | 3/2007 | Chiriac | H01L 23/427 |
| | | | 165/104.26 |
| 2008/0073062 A1 | 3/2008 | Schuette | |
| 2011/0198057 A1* | 8/2011 | Lange | F28D 15/0266 |
| | | | 165/104.26 |
| 2012/0328450 A1 | 12/2012 | Spangler et al. | |
| 2016/0227672 A1 | 8/2016 | Lin | |
| 2017/0049008 A1 | 2/2017 | Pascall et al. | |
| 2017/0364058 A1 | 12/2017 | Jagdale et al. | |
| 2018/0003451 A1 | 1/2018 | Azar et al. | |
| 2020/0107472 A1 | 4/2020 | Rush et al. | |

\* cited by examiner

ADDITIVELY MANUFACTURED COOLING ASSEMBLIES FOR THERMAL AND/OR MECHANICAL SYSTEMS, AND METHODS FOR MANUFACTURING THE ASSEMBLIES

CROSS-REFERENCE TO RELATED APPLICATIONS

This application claims priority to U.S. Provisional Application No. 62/739,688, which was filed on 1 Oct. 2018, and the entire disclosure of which is incorporated herein by reference.

FIELD

The subject matter described herein relates to cooling assemblies made using additive manufacturing.

BACKGROUND

Operation of electronic devices can require thermal management to ensure proper function. As the electronic devices become heated, the devices can suffer from degradation, functional failure, and lower lifespan. For example, the capability of avionics electronics is determined by the computing processing ability of the system. Typically, there are size and weight constraints for an avionics system. These systems are thermally limited such that, for a given volume, only a certain number of cores or processors can operate before thermal issues such as overheating occur. The processors can be de-rated to avoid overheating in high ambient temperature environments, but at the cost of potentially drastic reductions in processing capability. If the heat can be effectively removed from the system, more processing power, and ultimately more processing capability, may be possible from the same volume and weight.

There are a number of conventional cooling methods such as fans and heatsinks that are currently used to remove heat from the electronic circuitry and maintain the operational temperature range for the electronics. Technological improvements have continued to increase the device density and reduce packaging while also increasing the computing power and functionality such that thermal management systems are a key operational element. In addition, certain applications have restrictions in the size and weight that limit the cooling capacity and therefore limit the processing power and functionality of the electronics.

One example of a known cooling method uses a cold plate to cool heat sources. Some known cold plates are planar metal (e.g., aluminum) bodies formed from two planar halves that enclose a coolant tube (e.g., a copper tube). A liquid flowing in the internal tube of the cold plate cools heat sources that are in contact with the cold plate. This liquid carries heat away from the heat sources to cool the sources. These types of cold plates, however, tend to be heavy and bulky relative to the heat sources, and usually are limited to a planar geometry. As a result, these types of cold plates may not be useful in environments where weight is a constraining factor (e.g., in aircraft). Additionally, planar cold plates may not be able to effectively carry heat away from heat sources that are not planar.

BRIEF DESCRIPTION

In one embodiment, a multi-domain cooling assembly configured to be coupled with one or more heat sources includes a body having an outer surface and at least one cooling chamber disposed inside the body. The at least one cooling chamber extends in at least two orthogonal dimensions and includes a working fluid to extract thermal energy from the one or more heat sources. The assembly includes a cooling channel disposed within the body and fluidly coupled with a passageway that carries cooling fluid into and out of the cooling channel. At least a portion of the cooling fluid is a liquid phase, a gas phase, or a liquid-gas mix phase. The cooling channel is fluidly separate from the at least one cooling chamber. The cooling channel is thermally coupled with the at least one cooling chamber. The at least one cooling chamber transfers thermal energy from the working fluid to the cooling fluid.

In one embodiment, a multi-domain cooling assembly configured to be coupled with one or more heat sources includes a body having an outer surface and a cooling channel disposed inside the body and fluidly coupled with a passageway that carries cooling fluid into and out of the cooling channel. At least a portion of the cooling fluid is a liquid phase, a gas phase, or a liquid-gas mix phase. The cooling channel extending in at least two orthogonal dimensions. The assembly includes one or more of a conformal vapor chamber or a thermal energy storage reservoir. The conformal vapor chamber is enclosed within the body and holds a first working fluid inside the conformal vapor chamber. The thermal energy storage reservoir is enclosed within the body and includes a second working fluid. The one or more of the conformal vapor chamber or the thermal energy storage reservoir is configured to be thermally coupled with the cooling channel such that the one or more of the conformal vapor chamber or the thermal energy storage reservoir directs thermal energy from the one or more heat sources to the cooling channel.

In one embodiment, an additively manufactured body includes one or more cooling chambers enclosed inside the body. The one or more cooling chambers including one or more of a liquid phase, a gas phase, or a liquid-gas phase mixture of a working fluid inside the one or more cooling chambers. The one or more cooling chambers extending in at least two orthogonal dimensions. The body also includes a cooling channel fluidly coupled with a passageway that carries cooling fluid into and out of the cooling channel. At least a portion of the cooling fluid is a liquid phase, a gas phase, or a liquid-gas mix phase. The cooling channel extends in at least two orthogonal dimensions. The cooling channel is thermally coupled with the one or more cooling chambers. One or more of the cooling channel or the one or more cooling chambers extracts thermal energy from a heat source coupled with the additively manufactured body. The cooling channel and each of the one or more cooling chambers are fluidly separate from each other. The one or more cooling chambers and the cooling channel are configured to be additively manufactured within the body of the cooling assembly.

BRIEF DESCRIPTION OF THE DRAWINGS

The inventive subject matter may be understood from reading the following description of non-limiting embodiments, with reference to the attached drawings, wherein below.

DETAILED DESCRIPTION

One or more embodiments of the inventive subject matter described herein relates to multi-domain cooling assemblies or devices that are at least partially additively manufactured. In one embodiment, a multi-function cooling assembly is provided that includes at least one cooling chamber, such as an integrated conformal vapor chamber or an integrated thermal energy storage reservoir, that provides for storage of thermal energy (via phase change media), and that provides for multiphase operation during cooling (continually varying channels). The cooling chamber is thermally coupled with and fluidly separate from a cooling channel that moves cooling fluid to one or more positions within the multi-domain cooling assembly. Thermal energy is transferred from a heat source to a cooling fluid within the cooling channel directly or via a working fluid within the cooling chamber to extract thermal energy from the cooling assembly.

Figure 1:
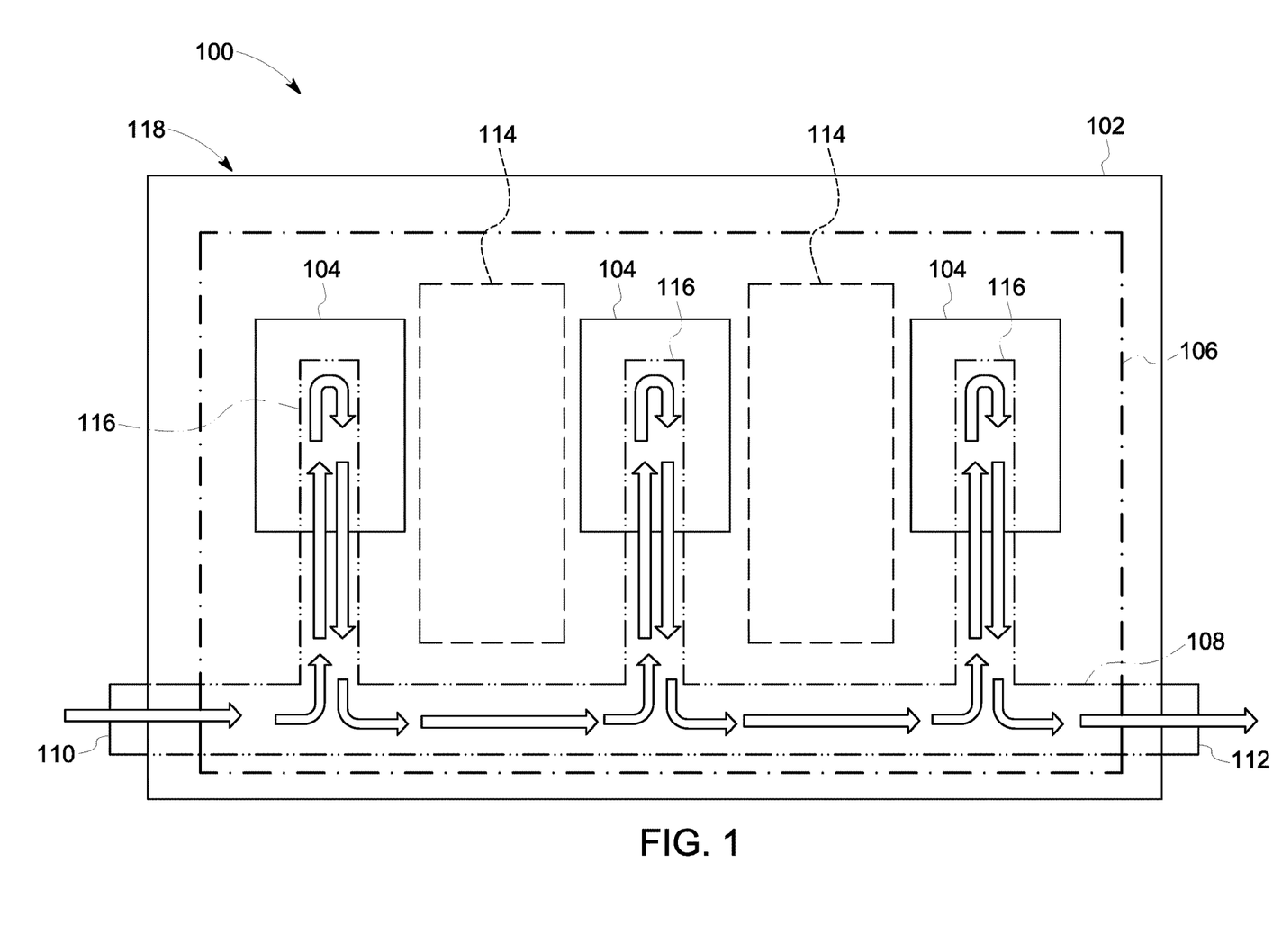
FIG. 1 illustrates a top view of one embodiment of a cooling assembly.

FIG. 1 illustrates a top view of one embodiment of a cooling assembly 100.

Figure 2:
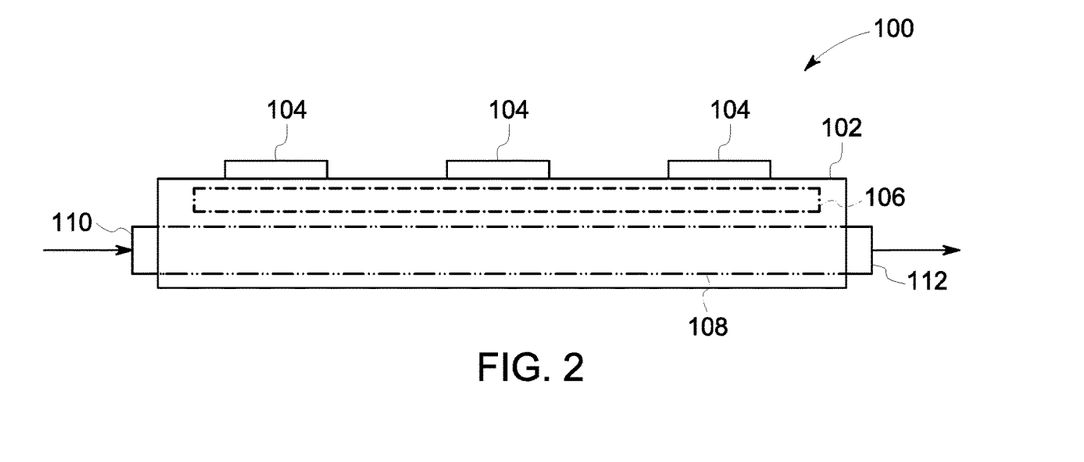
FIG. 2 illustrates a side or plan view of the cooling assembly shown in FIG. 1.

FIG. 2 illustrates a side or plan view of the cooling assembly 100 shown in FIG. 1. The cooling assembly 100 can be manufactured additively, which allows for the cooling assembly 100 to be more compact than non-additively manufactured cold plates or cold plate assemblies, to have three-dimensional shapes (e.g., the cooling assembly is not predominantly largest along only two orthogonal directions), and/or to have multi-domain cooling techniques within the same housing (e.g., multiple separate and distinct cooling chambers and/or channels). The cooling assembly 100 may also be referred to herein as a multi-domain cooling assembly having multiple different separate and distinct domains (e.g., chambers, channels, passageways, or the like) disposed inside the cooling assembly 100. The multiple domains may be fluidly separate and/or fluidly coupled with each other. Additive manufacturing can involve joining or solidifying material under computer control to create a three-dimensional object, such as by adding liquid molecules or fusing powder grains with each other. Examples of additive manufacturing include three-dimensional (3D) printing, rapid prototyping (RP), direct digital manufacturing (DDM), selective laser melting (SLM), electron beam melting (EBM), direct metal laser melting (DMLM), or the like. Alternatively, the cooling assembly 100 can be formed in another manner.

The cooling assembly 100 includes a body 118 having an outer surface 102 that is in contact with or is proximate to one or more heat sources 104, such as electronic components (e.g., computer processors, graphic cards, or the like). While the cooling assembly 100 is shown as a planar body or object (e.g., the assembly 100 is substantially longer in two orthogonal directions compared to a third orthogonal direction) with each surface of the outer surface 102 of the body 118 being substantially planar surfaces, one or more of the surfaces of the outer surface may be a non-planar surface. The cooling assembly 100 can have a variety of any three-dimensional shape, such as curved, a cube shape, a cone shape, a flat shape with fins or other extensions, or the like. For example, the cooling assembly 100 may have a body 118 that is shaped to conform with a turbine blade of an engine, one or more electrical components of an electrical system, a component of a vehicle system, or the like.

The cooling assembly 100 includes plural different and distinct cooling chambers 106, 114. In one embodiment, one or more of the cooling chambers 106 is an internal conformal vapor chamber 106. The conformal vapor chamber 106 is disposed inside the body 118 and is thermally coupled with the one or more heat sources 104. A working fluid (e.g., a first working fluid) is disposed inside and is entirely contained within the conformal vapor chamber 106. The working fluid within the conformal vapor chamber 106 receives thermal energy from the heat sources 104 and spreads heat from the heat sources 104. The conformal vapor chamber 106 is integrated within the body 118 of the cooling assembly 100 as a result of the vapor chamber 106 being additively manufactured with the body 118 of the cooling assembly 100.

The conformal vapor chamber 106 includes hermetic walls extending around and defining the enclosed conformal vapor chamber 106. Although the conformal vapor chamber 106 is shown as a substantially planar cooling chamber, the vapor chamber 106 may be a three-dimensional body that extends in at least two orthogonal dimensions. For example, the conformal vapor chamber 106 may have one or more non-planar hermetic walls such that the conformal vapor chamber 106 may be of any arbitrary shape and/or size in order to position, move, or direct the working fluid proximate to each of the heat sources 104. The conformal vapor chamber 106 is a hermetically sealed chamber that can have a porous wick structure or lining along one or more inner surfaces of the chamber. For example, the conformal vapor chamber 106 includes plural planar and/or non-planar hermetic walls that extend around and define the enclosed conformal vapor chamber 106.

The working fluid is held in the conformal vapor chamber 106, such as in pores of a wick lining (not shown) of the vapor chamber 106. For example, the conformal vapor chamber 106 is a cooling passageway for the working fluid to move within the vapor chamber 106 with conformal cooling within the vapor chamber 106. Upon exposure to thermal energy from the heat sources 104, the working fluid absorbs or extracts thermal energy from the heat sources 104 and at least a portion of the working fluid changes phase from liquid to a vapor or gas. In the vapor phase or gas phase, the working fluid leaves the pores and moves away from the heat sources 104 in the conformal vapor chamber 106. The working fluid of the conformal vapor chamber 106 condenses in regions where heat is being rejected. For example, the working fluid may cool and condense (e.g., change from a vapor phase or a gas phase into a liquid phase, or from a vapor or gas phase into a liquid-gas phase mixture) near a cooling channel 108, a second cooling chamber (e.g., a thermal energy storage reservoir 114), or the like. The liquid phase of the working fluid recirculates back to the pores in the lining through capillary forces where the fluid again absorbs thermal energy from the heat sources 104.

In one or more embodiments, the cooling assembly 100 may include any number of conformal vapor chambers 106 that may be separate and distinct from each other vapor chamber 106, or may be fluidly coupled with one or more other vapor chambers 106. Each of the vapor chambers 106 may be additively manufactured within the body 118 of the cooling assembly 100. Optionally, each of the conformal vapor chambers 106 may have any unique and/or common shapes, sizes, orientations, or the like, relative to each other conformal vapor chamber 106.

Figure 3:
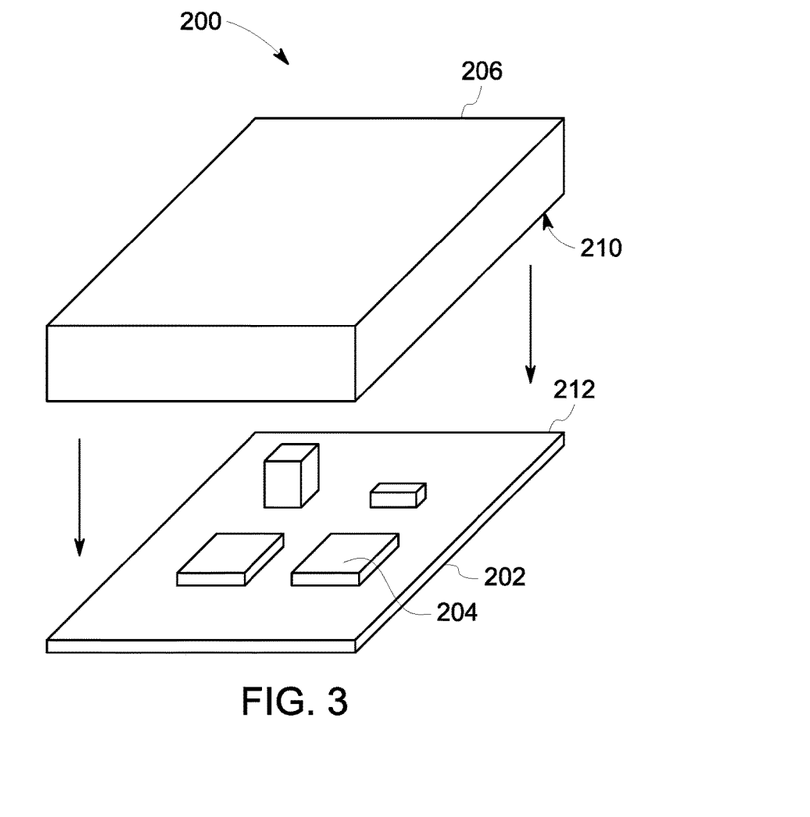
FIG. 3 illustrates an exploded perspective view of a cooling assembly in accordance with one embodiment.
Figure 4:
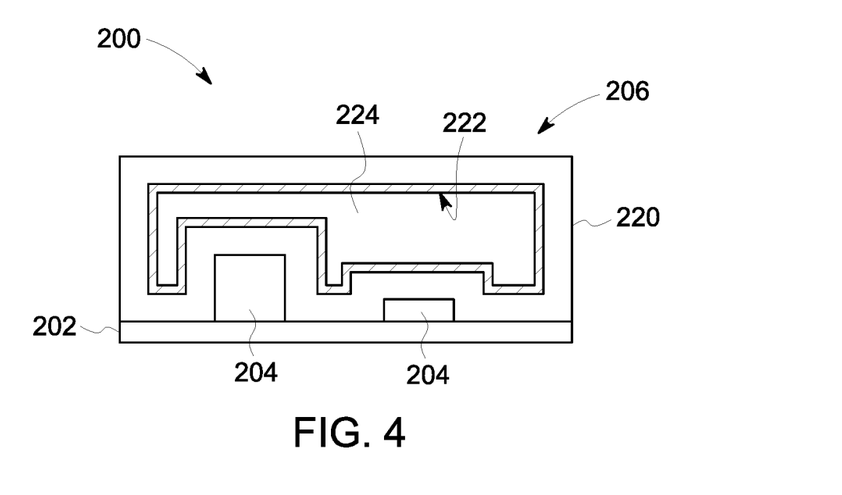
FIG. 4 illustrates a cross-sectional view of the cooling assembly shown in FIG. 3.

FIG. 3 illustrates an exploded perspective view of a cooling assembly 200 in accordance with one embodiment. FIG. 4 illustrates a cross-sectional view of the cooling assembly 200. The cooling assembly 200 includes a conformal vapor chamber 206 that is coupled with a printed circuit board 202 having plural different heat producing components 204. A first side 210 of the conformal vapor chamber 206 is coupled with a first side 212 of the printed circuit board 202. The conformal vapor chamber 206 includes plural hermetic walls 220 that define and enclose a vapor space 224 disposed inside the conformal vapor chamber 206. The hermetic walls 220 are shaped to extend around the plural different heat producing components 204 coupled with the printed circuit board 202. The conformal vapor chamber 206 also includes as a porous wick lining 222 that may extend along at least a portion of an interior surface of one or more of the hermetic walls 220. The porous wick lining 222 may be porous with liquid disposed within the vapor space 224.

In one embodiment, one or more of the cooling chambers disposed inside the body 118 may be the thermal energy storage reservoirs 114. Each of the thermal energy storage reservoirs 114 include containment walls extending around and defining each of the enclosed thermal energy storage reservoirs 114. In one embodiment, the containment walls may be hermetic walls extending around and defining each of the enclosed thermal energy storage reservoirs 114. Although the thermal energy storage reservoirs 114 are illustrated as planar, substantially rectangular cooling chambers, one or more of the containment walls may be non-planar walls defining the thermal energy storage reservoirs 114 having any arbitrary shape and/or size. The thermal energy storage reservoirs 114 may be additively manufactured with the body 118 of the cooling assembly 100 and may have any planar or non-planar shape and orientation relative to the body 118. Each of the thermal energy storage reservoirs 114 are sealed reservoirs that are fluidly separate and distinct from each other and the other volumes of the cooling assembly 100. Optionally, two or more thermal energy storage reservoirs 114 may be fluidly coupled with each other thermal energy storage reservoir 114 and/or an alternative cooling chamber inside the body 118.

The thermal energy storage reservoirs 114 provide transient or temporary thermal capacity. For example, the thermal energy storage reservoirs 114 include a working fluid (e.g., a second working fluid that is separate from the first working fluid disposed within the conformal vapor chamber 106) such as a phase change material or media that changes phases as a result of thermal energy received from the heat sources 104. The phase change material may be a natural or engineered material, such as wax, or the like, that may change between a liquid phase and a solid phase or between a liquid phase or solid phase and a liquid-solid phase mixture. The phase change material extracts and stores thermal energy from the heat sources 104. The thermal energy storage reservoirs 114 may extract thermal energy directly from the heat sources 104 or via the vapor chamber 106. The phase change material may be added to the thermal energy storage reservoirs 114 as the cooling assembly 100 is being manufactured or during post-manufacturing of the cooling assembly 100. The thermal energy storage reservoirs 114 may also be thermally coupled with the conformal vapor chamber 106 and/or the cooling channel 108 to direct thermal energy from the vapor chamber 106 to the cooling channel 108. Passages (not shown) connecting to reservoirs 106, 114 may be designed into the body 118 allowing appropriate fluids to fill or at least partially fill these reservoirs 106, 114 and subsequently hermetically sealed. Sealing methods may include welding, brazing, crimping, or the like.

In one or more embodiments, the multi-domain cooling assembly 100 may include one or more conformal vapor chambers 106 and one or more thermal energy storage reservoirs 114. For example, FIGS. 1 and 2 illustrate the cooling assembly 100 including one conformal vapor chamber 106 and two thermal energy storage reservoirs 114. Optionally, the multi-domain cooling assembly 100 may be devoid of the conformal vapor chamber 106 and/or the thermal energy storage reservoir 114, may include any number of vapor chambers 106, may include any number of thermal energy storage reservoirs 114, or any combination therein.

The cooling assembly 100 also includes the cooling channel 108 disposed within and extending through the body 118 of the cooling assembly 100. The cooling channel 108 can be fluidly coupled with an external passageway 110, 112 that carries cooling fluid into and out of the cooling channel 108. For example, a pump may direct a flow of cooling fluid into the cooling channel 108 through the passageway 110 (e.g., a section of piping, tubing, or the like). The cooling fluid can flow through the cooling channel 108 and absorb thermal energy from the heat sources 104. The cooling channel 108 is fluidly separate from each of the cooling chambers (e.g., the conformal vapor chamber 106 and the thermal energy storage reservoirs 114) such that the cooling fluid inside the cooling channel 108 does not mix with or combine with the working fluid of the conformal vapor chamber 106 and/or the working fluid of the thermal energy storage reservoir 114.

The cooling channel 108 is thermally coupled with the heat sources 104 directly, via the conformal vapor chamber 106, and/or via the thermal energy storage reservoirs 114. For example, the gas or vapor phase of the working fluid in the conformal vapor chamber 106 may condense near the cooling channel 108 by transferring thermal energy from the heat sources 104 to the cooling fluid that is flowing or otherwise moving in the cooling channel 108. Optionally, the cooling fluid may change between a liquid phase and a gas phase as the cooling fluid extracts thermal energy from the working fluid (e.g., a first working fluid) disposed within the conformal vapor chamber 106 and/or from the working fluid (e.g., a second working fluid) disposed within the thermal energy storage reservoirs 114. The cooling fluid that is heated in the cooling channel 108 can continue moving through the channel 108 and out of the cooling assembly 100 via the passageway 112. The cooling channel 108 can carry the heated cooling fluid out of the cooling assembly 100 to cool or discard the cooling fluid. If the heated cooling fluid is cooled outside of the cooling assembly 100, then the cooled fluid may be re-directed into the cooling assembly 100 via the passageway 110 (e.g., by the pump).

In one or more embodiments, upon exposure to thermal energy from the heat sources 104 (e.g., directly, via the vapor chamber 106, and/or via the thermal energy storage reservoirs 114), the cooling fluid absorbs thermal energy and at least a portion of the cooling fluid changes phase from liquid to a vapor or gas. Alternatively, the temperature of the cooling fluid may rise as a result of exposure to thermal energy from the heat sources 104, however may not change phases from the liquid to the vapor or gas. For example, the cooling fluid may change from a first single phase (e.g., liquid) to a second single phase (e.g., gas or vapor) or to a multiphase (e.g., liquid and gas mix). Optionally, the cooling fluid may remain in the liquid phase having an increased temperature relative to the cooling fluid not exposed to the thermal energy from the heat sources 104.

The cooling channel 108 includes plural serpentine conduit extensions 116 that direct the cooling fluid within the cooling channel 108 toward each of the heat sources 104. For example, the cooling channel 108 and the conduit extensions 116 are shaped and sized to move the cooling fluid toward each of the heat sources 104. In the illustrated embodiment, the cooling channel 108 includes three conduit extensions 116 that extend in substantially similar or common directions. For example, each conduit extension 116 directs or moves the cooling fluid toward each heat source 104. Optionally, the cooling channel 108 may include any number of conduit extensions that may direct the cooling fluid in any common or different three-dimensional directions within the body 118 of the cooling assembly 100 toward one or more heat sources 104. The conduit extensions 116 may have varying channel sizes and positions within the cooling assembly 100 to bring the cooling fluid proximate the heat sources 104, the conformal vapor chamber 106, and/or the thermal energy storage reservoirs 114. For example, the conduit extensions 116 may be sized and shaped to control a pressure drop of the cooling fluid that flows within the cooling channel 108 of the cooling assembly 100.

In one or more embodiments, the cooling assembly 100 may include two or more different cooling channels 108. The different cooling channels 108 may include different passageways (e.g., different inlets and outlets) that extend in different directions and may be fluidly coupled with each other or may be fluidly separate from each other. For example, a first cooling channel 108 may direct cooling fluid toward a first heat source, and second cooling channel 108 may be fluidly coupled with the first cooling channel 108 and may direct the cooling fluid toward a different, second heat source. The plural cooling channels 108 may be uniquely oriented relative to each other cooling channel 108 to direct cooling fluid proximate to the different heat sources 104.

Although the cooling channel 108 is shown as a planar structure, the cooling channel 108 may be a three-dimensional body such that one or more channel walls defining the cooling channel 108 may be planar or non-planar. For example, one or more walls or surfaces of the cooling channel 108 may lie or be disposed in two different planes, therefore having a three-dimensional quality. Additionally, the cooling channel 108 is shown as substantially planar with the conformal vapor chamber 106 and each of the thermal energy storage reservoirs 114. In alternative embodiments, the cooling channel 108, the vapor chamber 106, and/or the thermal energy storage reservoirs 114 may have any alternative uniform or unique shape and/or size relative to each other. For example, the additively manufactured cooling assembly 100 allows for each of the cooling channels 108 and each cooling chamber (e.g., the conformal vapor chamber 106 or the thermal energy storage reservoirs 114) to have any three-dimensional shape at any position within the body 118 of the cooling assembly 100.

The cooling channel 108 is a chamber that is integrated within the body 118 of the cooling assembly 100. For example, the cooling channel 108 may include one or more hermetic channel walls that define the cooling channel 108. The cooling channel 108 may also have an enhancement structure (not shown) such as a porous wick structure or lining along one or more inner surfaces of the channel. For example, the enhancement structure may be a surface area enhancement structure or a thermal energy enhancement structure. The enhancement structure may promote the transfer of thermal energy from the heat sources 104 and/or the vapor chamber 106, may increase the surface area of the cooling channel 108 to promote bubbling or boiling of the cooling fluid in the liquid phase, may separate the multiphase liquid and gas mixture of the cooling fluid within the cooling channel 108, or the like. The enhancement structure may be varying fluid channel size or location, expanding and contracting channel cross-sectional areas to accommodate the production of vapor or gas phase of the cooling fluid, may be surface features such as fins to promote boiling or bubbling of the fluid, may be integrated swirling features to vortex the multiphase liquid and vapor mixture to separate the liquid from the vapor, or the like.

In one or more embodiments, the cooling assembly 100 includes four or more different material domains that are additively manufactured in the cooling assembly 100. For example, the four or more different material domains may include different materials, such as waxes with different melting temperatures. Using different working materials in the different material domains may be used to stage the heat transfer in multiple conformal vapor chambers. A base material, for example, makes up the body 118 of the cooling assembly 100, the cooling fluid moves through the cooling channel 108, the first working fluid moves inside the volume of the conformal vapor chamber 106, and the second working fluid or the phase change material is held within the thermal energy storage reservoirs 114. Optionally, the cooling assembly 100 may be void of the vapor chamber 106 and/or the thermal energy storage reservoirs 114, the cooling assembly 100 may include two or more different and distinct cooling channels 108, vapor chamber 106, and/or thermal energy storage reservoirs 114, or any combination therein. Optionally, each of the cooling channels 108 and the cooling chambers (e.g., the conformal vapor chamber 106 and the thermal energy storage reservoir 114) may be fluidly separate from each other.

The additively manufactured cooling assembly 100 may be formed of a common or different metal or metal alloys. For example, the body 118 and the hermetic walls of each of the cooling chambers 106, 114, and the hermetic walls of the cooling channel 108 may be manufactured of a common metal alloy. Optionally, the additively manufactured cooling assembly 100 may be manufactured with the body 118 being manufactured of a first material and each wall of each of the cooling chambers 106, 114 and the cooling channel 108 being manufactured of a different, second material, or the same first material but having different properties, or the like. Optionally, a portion of the cooling assembly 100 may be manufactured of a metal or metal alloy, and another portion of the cooling assembly 100 may be manufactured of a non-metal material.

Figure 5:
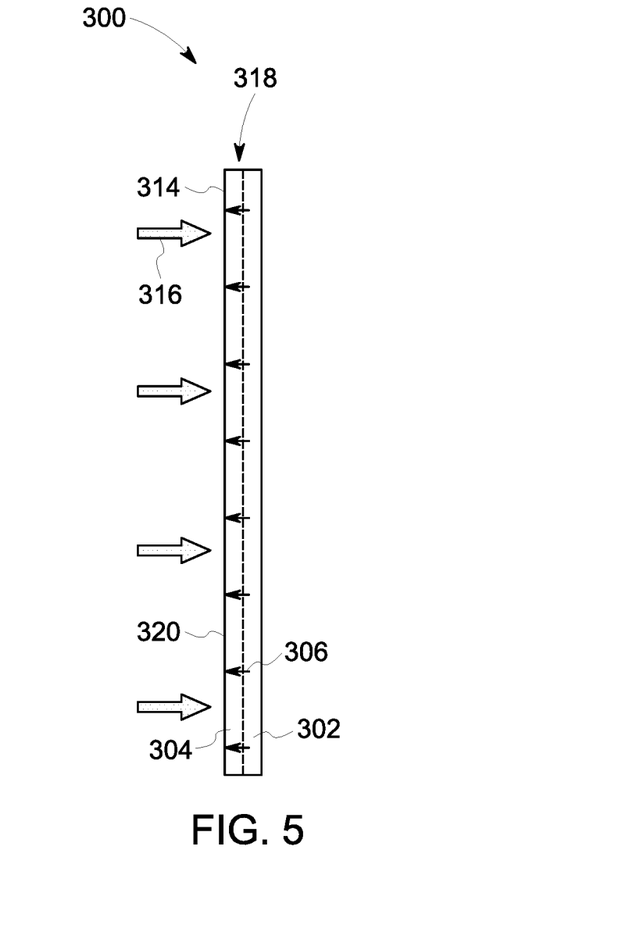
FIG. 5 illustrates a side cross-sectional view of one embodiment of a cooling assembly.
Figure 6:
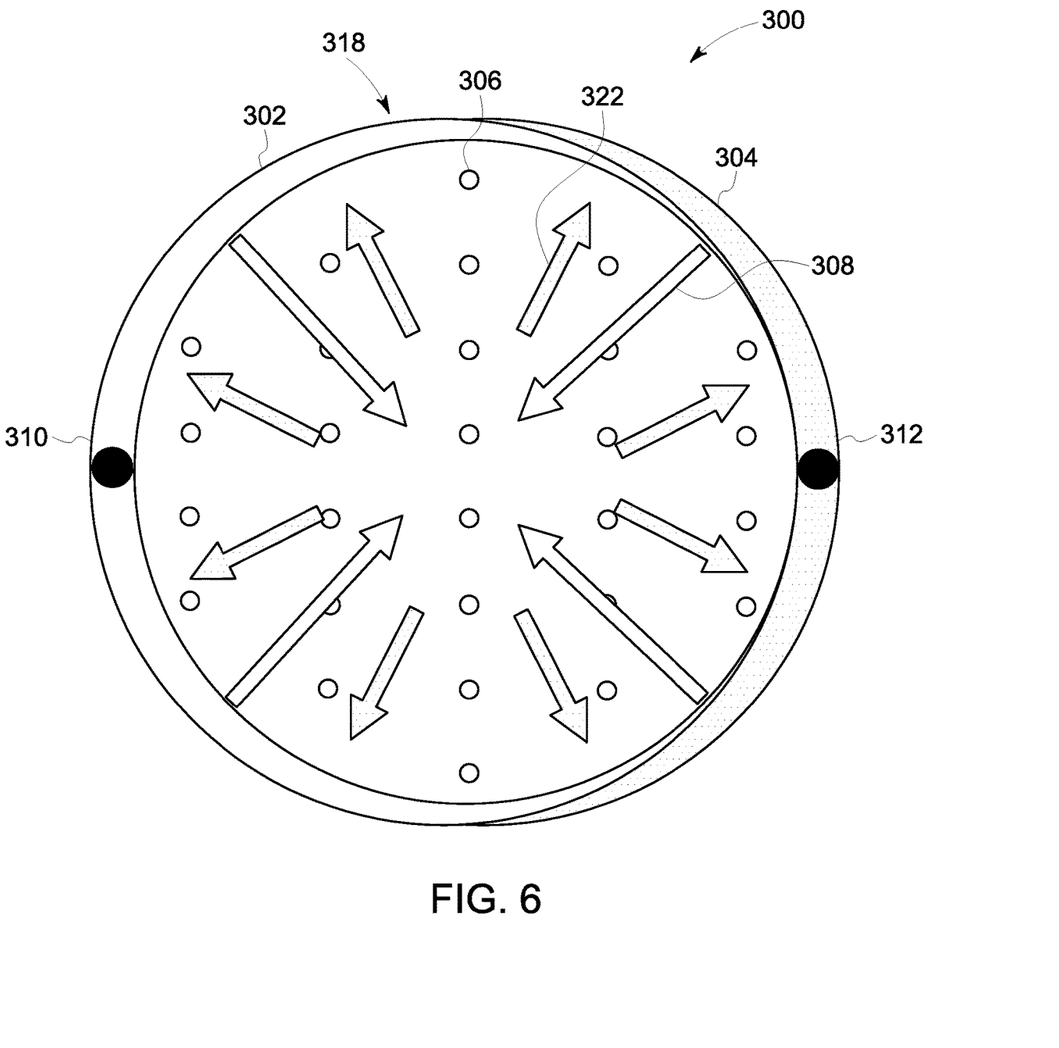
FIG. 6 illustrates a top cross-sectional view of the cooling assembly shown in FIG. 5.

FIG. 5 illustrates a side cross-sectional view of one embodiment of a cooling assembly 300. FIG. 6 illustrates a top cross-sectional view of the cooling assembly 300 shown in FIG. 5. The cooling assembly 300 includes a body 318 that includes an outer surface 314. Like the cooling assembly 100 shown in FIGS. 1 and 2, the cooling assembly 300 is additively manufactured via one or more additive manufacturing methods. A first side 320 of the outer surface 314 is exposed to thermal energy from a heat source 316. For example, the heat source 316 may be exhaust from a turbine engine system, from an electronic system or assembly, or the like.

The cooling assembly 300 includes an inlet plenum 302 extending through the cooling assembly 300. The inlet plenum 302 is integrated within the body 318 of the cooling assembly 300. The inlet plenum 302 is fluidly coupled with an inlet passageway 310 that carries cooling fluid into the cooling assembly 300. The cooling assembly 300 also includes an outlet plenum 304 disposed within and extending through the cooling assembly 300. The inlet and outlets plenums 302, 304 are integrated within the body 318 of the cooling assembly 300. Although the inlet and outlet plenums 302, 304 are shown as planar chambers having substantially the same or similar shapes and sizes, alternatively, the inlet and outlet plenums 302, 304 may be any three-dimensional body, each having a unique or common shape, size, orientation relative to the other and/or relative to the shape of the outer surface 314 of the body 318. The inlet and outlet plenums 302, 304 may also be referred to herein as inlet and outlet cooling channels, respectively.

The inlet and/or the outlet plenums 302, 304 may also have enhancement structures (not shown), such as a porous wick structure or lining along one or more inner surfaces of the inlet and outlet plenums 302, 304, respectively. The enhancement structures may be surface area or thermal energy enhancement structures that may promote the transfer of thermal energy from the heat source 316 to the cooling fluid within the cooling assembly 300. For example, the enhancement structures may promote the transfer of thermal energy from the heat sources 316 to the cooling fluid, may increase the surface area of the outlet plenum 304 to promote bubbling or boiling of the cooling fluid in the liquid phase, may be shaped and sized to control pressure or a pressure drop between the inlet and outlet plenums 302, 304, or the like.

The outlet plenum 304 is fluidly coupled with an outlet passageway 312 that carries the cooling fluid out of the cooling assembly 300. For example, a pump may direct a flow of cooling fluid into the cooling assembly 300 through the inlet passageway 310 (e.g., a section of piping, tubing, or the like) and out of the cooling assembly 300 through the outlet passageway 312. The cooling fluid that is heated in the outlet plenum 304 via the transfer of thermal energy from the heat source 316 can continue moving through the outlet plenum 304 and out of the cooling assembly 300 via the outlet passageway 312. The outlet passageway 312 can carry the heated cooling fluid out of the cooling assembly 300 to cool and recycle the cooling fluid or to discard the cooling fluid. If the heated cooling fluid is cooled outside of the cooling assembly 300, then the cooled fluid can be re-directed into the cooling assembly 300 via the inlet passageway 310 (e.g., by the pump).

In one or more embodiments, the cooling assembly 300 may also include one or more cooling chambers (not shown) like the cooling chambers 106, 114 illustrated in FIGS. 1 and 2. The cooling chambers may be thermally coupled with the inlet and/or outlet plenums 302, 304 and may be fluidly separate from the inlet and/or outlet plenums 302, 304. For example, one or more cooling chambers may be disposed inside the body 318 and contain working fluids that extract thermal energy from the heat source 316.

The outlet plenum 304 is fluidly coupled with the inlet plenum 302 via plural impingement holes 306 that are integrated within the body 318 of the additively manufactured cooling assembly 300. Optionally, the inlet and outlet plenums 302, 304 may be fluidly coupled via one or more other holes, passages, or the like, that may direct the flow of fluid between the inlet and outlet plenums 302, 304. The impingement holes 306 are shown in a patterned configuration, however the holes 306 may be disposed in any pattern and/or random configuration. The cooling assembly 300 that is manufactured additively allows for the cooling assembly 300 to have any number of impingement holes 306 in any plane of the body 318, extending in any orthogonal direction within the body 318, or the like, relative to non-additively manufactured cold plates. Additionally or alternatively, the impingement holes 306 and/or the plenums 302, 304 may be shaped, sized, and oriented to control a pressure drop of the cooling fluid that flows within the cooling assembly 300.

The configuration of the impingement holes 306 (e.g., size, shape, orientation, or the like) directs the cooling fluid within the cooling assembly 300. In the illustrated embodiment, the cooling fluid is directed in a first direction 308 within the inlet plenum 302, and then in a second direction 322 within the outlet plenum 304. For example, the cooling fluid that flows into the cooling assembly 300 through the inlet passageway 310 is directed around a portion of the perimeter of the inlet plenum 302. From the perimeter of the inlet plenum 302, the cooling fluid flows in the first direction 308 generally towards a center of the inlet plenum 302. The cooling fluid is directed through the impingement holes 306 and is directed toward the inner surface of the outlet plenum 304 that is opposite the first side 320 of the body 318. The cooling fluid is directed in the second direction 322 generally towards a portion of the perimeter of the outlet plenum 304 and then out of the cooling assembly 300 via the outlet passageway 312.

The impingement holes 306 are shaped and sized to direct the cooling fluid toward the inner surface of the outlet plenum 304 to cool the inner surface of the outlet plenum 304 (e.g., the inner surface opposite the first side 320). In the illustrated embodiment of FIG. 6, the impingement holes have a substantially circular cross-sectional shape, however one or more of the impingement holes may have any alternative quadrilateral shape such as oval, rectangular, diamond, trapezoidal, or the like. Upon exposure to thermal energy from the heat source 316, the cooling fluid absorbs thermal energy. In one or more embodiments, at least a portion of the cooling fluid changes phase from liquid to a vapor or gas. For example, the cooling fluid may change from a first single phase (e.g., liquid) to a second single phase (e.g., gas or vapor), or from the first single phase to a multiphase (e.g., liquid and gas mix). Optionally, the cooling fluid may remain in the liquid phase but the temperature of the cooling fluid may be increased relative to the temperature of the cooling fluid not exposed to the thermal energy from the heat source 316 (e.g., the temperature of the cooling fluid flowing into the inlet passageway 310).

In the illustrated embodiment, the inlet plenum 302, the outlet plenum 304, and the impingement holes 306 are shaped, sized, and oriented to direct the cooling fluid in a direction toward the heat source 316. Optionally, the heat source 316 may be directed toward only a portion of the first side 320 of the body 318 and the inlet plenum 302, outlet plenum 304, and the impingement holes 306 may have an alternative orientation to direct the cooling fluid toward the portion of the first side 320 proximate the heat source 316.

Figure 7:
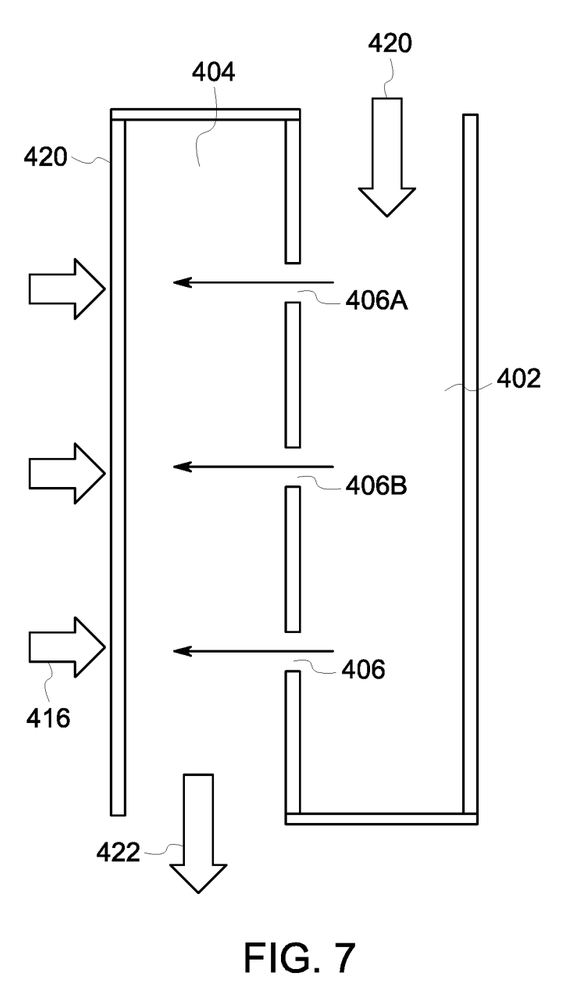
FIG. 7 illustrates a side cross-sectional view of a cooling assembly in accordance with one embodiment.

FIG. 7 illustrates a side cross-sectional view of a cooling assembly 400 in accordance with one embodiment. The cooling assembly 400 is like the cooling assembly 300 illustrated in FIG. 5, however the cooling assembly 400 includes an inlet plenum 402 and an outlet plenum 404 that include a serpentine structure. Cooling fluid moves in a direction 420 into the inlet plenum 402. One or more impingement holes 406 are shaped to direct the cooling fluid in a direction toward a heat source 416 disposed at a first side 420 and in a general direction towards the outlet plenum 404. The impingement holes 406 may be shaped such that each impingement hole 406 may control an amount of the cooling fluid that is directed from the inlet plenum 402 to the outlet plenum 404. For example, a first impingement hole 406A may have a size that is smaller relative to a size of a second impingement hole 406B. The smaller first impingement hole 406A may direct a smaller or lesser amount of the cooling fluid from the inlet plenum 402 to the outlet plenum 404 than the second impingement hole 406B. The cooling fluid is directed out of the outlet plenum 404 in a direction 422.

Although the inlet and outlet plenums 302, 304, 402, 404 are illustrated as substantially planar volumes having common shapes and sizes, alternatively one or more of the plenums 302, 304, 402, 404 may extend in any alternative direction, may have an alternative shape and size relative to the other, or the like. For example, the additively manufactured cooling assembly 300 can include multiple separate and distinct volume domains that may have any three-dimensional shape.

Figure 8:
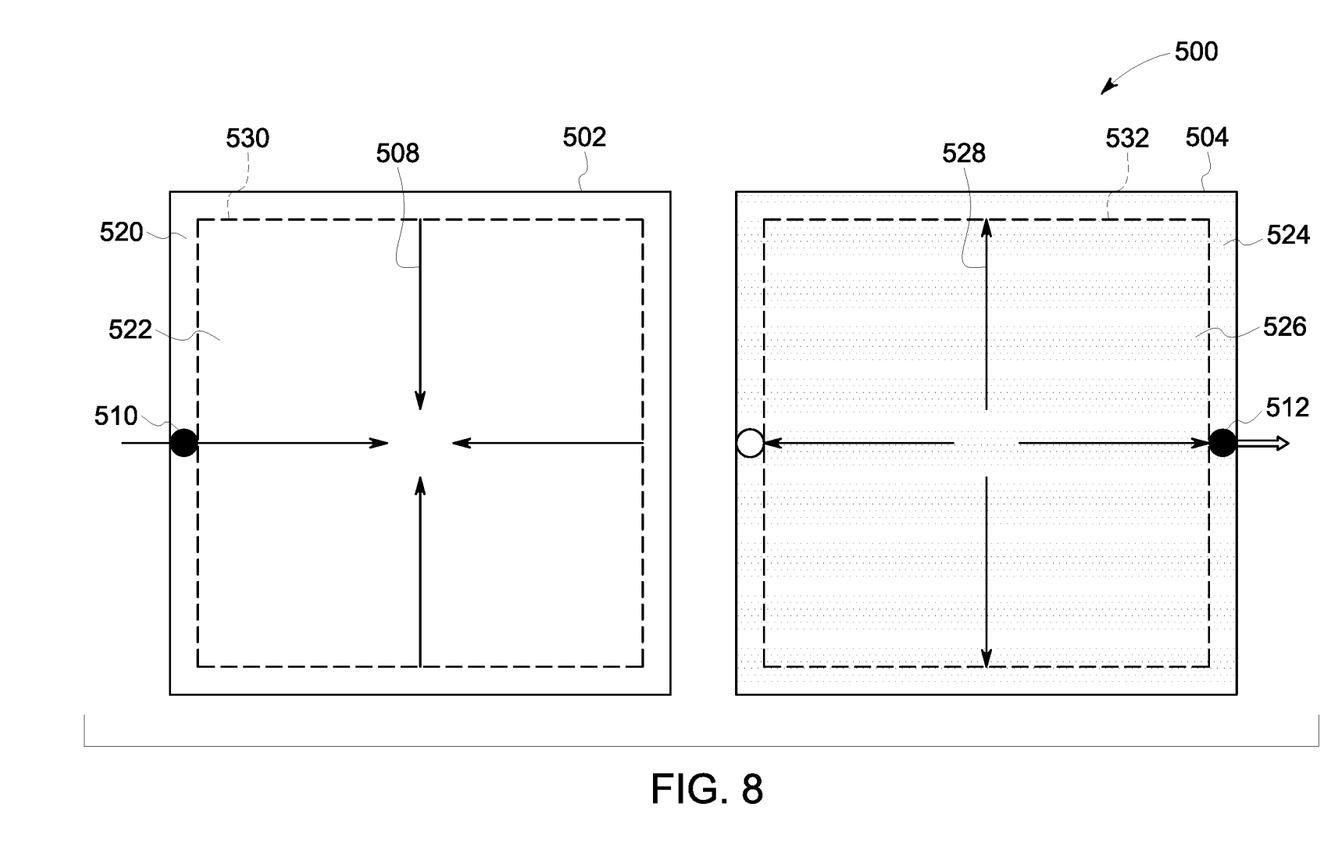
FIG. 8 illustrates an exploded top view of one embodiment a cooling assembly.
Figure 9:
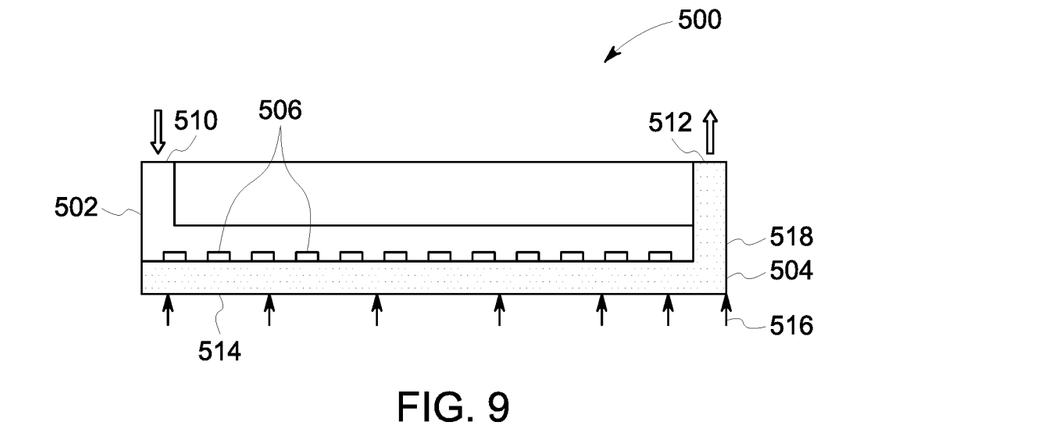
FIG. 9 illustrates a side view of the assembled cooling assembly shown in FIG. 8.

FIG. 8 illustrates an exploded top view of one embodiment a cooling assembly 500. FIG. 9 illustrates a side view of the assembled cooling assembly 500 shown in FIG. 8. Like the cooling assembly 300 shown in FIGS. 5 and 6, the cooling assembly 500 includes an inlet plenum 502 and an outlet plenum 504 extending within a body 518 of the cooling assembly 500. The inlet plenum 502 includes a perimeter cavity 520 and an interior cavity 522 that is fluidly coupled with the perimeter cavity 520 via plural head holes 530. The outlet plenum 504 includes a perimeter cavity 524 and an interior cavity 526 that is fluidly coupled with the perimeter cavity 524 via plural head holes 532. Optionally, plural pins, posts, holes, passages, or the like, may be disposed between the perimeter cavity 520 and the interior cavity 522 of the inlet plenum 502 or between the perimeter cavity 524 and the interior cavity 526 of the outlet plenum 504 to control the flow of cooling fluid within the inlet plenum 502.

The inlet and outlet plenums 502, 504 are fluidly coupled via plural impingement holes 506 (shown in FIG. 9). Cooling fluid is directed into the cooling assembly 500 through an inlet manifold 510. The cooling fluid flows around at least a portion of the perimeter cavity 520 of the inlet plenum 502 and is directed toward the interior cavity 522 via the head holes 530. For example, the head holes 530 control the flow (e.g., distribution, flow rate, volume, or the like) of the cooling fluid within the inlet plenum 502. The cooling fluid is subsequently directed in a first direction 508 generally toward a center of the inlet plenum 502. The impingement holes 506 direct the cooling fluid from the inlet plenum 502 in a direction toward an inner surface of the outlet plenum 504 within the interior cavity 526. For example, the impingement holes 506 direct the cooling fluid toward an interior surface of the outlet plenum 504 that is opposite an outer surface 514 of the cooling assembly 500 that is exposed to thermal energy from a heat source 516. Thermal energy is extracted from the heat source 516 by the cooling fluid. The heated cooling fluid (e.g., relative to the cooling fluid disposed within the inlet plenum 502) is directed in a second direction 528, generally toward and into the perimeter cavity 524 of the outlet plenum 504 via the head holes 532. For example, the head holes 532 control the flow (e.g., distribution, flow rate, volume, or the like) of the cooling fluid out of the interior cavity 526 of the outlet plenum 504. The cooling fluid is subsequently directed from the perimeter cavity 524 and out of the cooling assembly 300 via an outlet manifold 512.

The head holes 530, 532 and the impingement holes 506 may be disposed in any pattern and/or random configuration to control the flow of the cooling fluid within the cooling assembly 500. The cooling assembly 500 is additively manufactured and allows for the cooling assembly 500 to have any number of impingement holes 506 in any plane of the body 518, extending in any orthogonal direction within the body 518, or the like, relative to non-additively manufactured cold plates. Additionally, the additively manufactured inlet and outlet plenums 502, 504 may have any three-dimensional shape, may be non-planar, may extend in any common or unique directions, may include any number of cavities, or the like. Optionally, the cooling assembly 500 may include one or more cooling chambers that may be thermally coupled with the inlet plenum 502 and/or the outlet plenum 504 and may be fluidly separate from the inlet and outlet plenums 502, 504.

Figure 10:
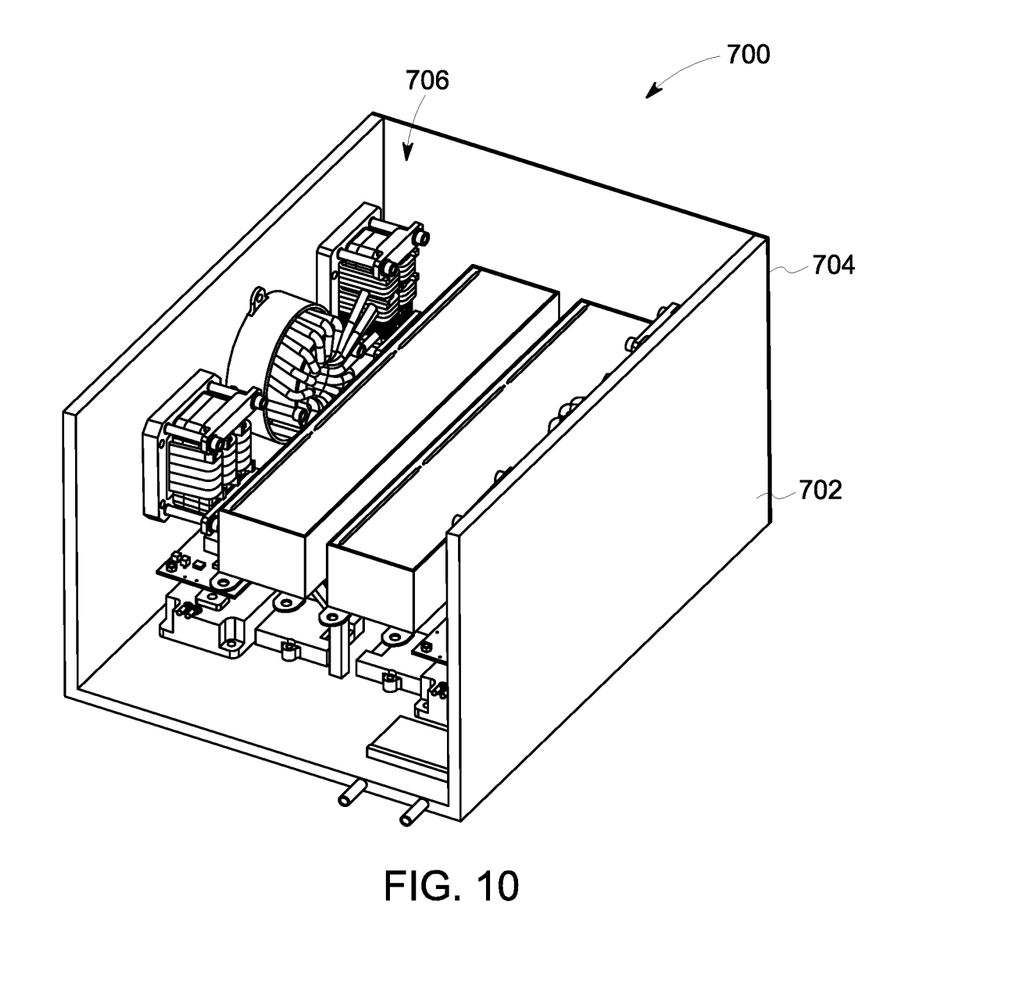
FIG. 10 a perspective partial view of one embodiment of an electrical system.
Figure 11:
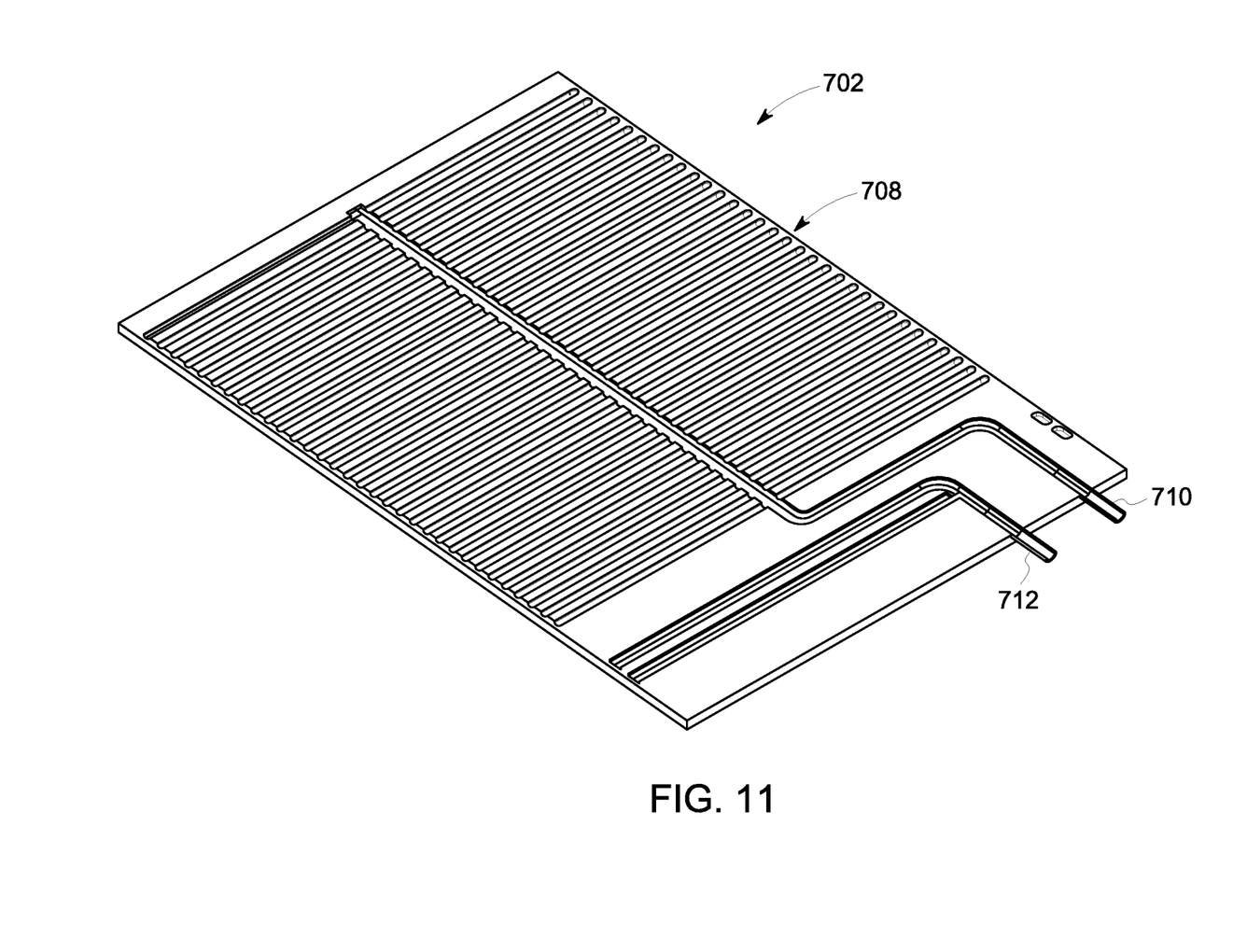
FIG. 11 illustrates a cross-sectional view of a cooling assembly of the electrical system shown in FIG. 10.

FIG. 10 illustrates a perspective partial view of one embodiment of an electrical system 700. FIG. 11 illustrates a cross-sectional view of a cooling assembly 702 of the electrical system 700 shown in FIG. 10. The electrical system 700 may be a power converter assembly, such as a computer system including hardware and/or software components, however the electrical system 700 may be any alternative powered system that generates thermal energy. The electrical system 700 includes plural walls 704 that define an interior cavity 706 of the electrical system 700. A top wall and a side wall are removed for illustrative purposes. In the illustrated embodiment, the walls 704 are coupled with each other to form a substantially cubical structure, however, each of the walls 704 may have any alternative planar and/or non-planar orientation.

The electrical system 700 includes the cooling assembly 702 that is integrated and extends within one of the walls 704 of the electrical system 700. For example, the wall 704 of the electrical system 700 may be additively manufactured with the cooling assembly 702 formed inside the wall 704. The cooling assembly 702 includes passageways 710, 712 that direct cooling fluid into and out of a cooling channel 708 of the cooling assembly 702. In the illustrated embodiment, the cooling channel 708 includes an array of serpentine conduits that extend within the wall 704. The conduits form the cooling channel 708 through which the cooling fluid flows within the cooling assembly 702 to direct the cooling fluid toward different heat sources within the electrical system 700. The conduits of the cooling channel 708 are thermally coupled with the one or more heat sources within the electrical system 700 such that thermal energy is transferred from the heat sources to the cooling fluid. The cooling fluid is directed into the cooling channel 708 via the passageway 710 and the heated cooling fluid is directed out of the cooling assembly 702 via the passageway 712. The conduits of the cooling channel 708 are designed to control the pressure and/or a pressure drop as a result of the cooling fluid flowing within the cooling assembly 702, may include varying channel cross-sectional shapes and sizes, may extend in two or more different directions, may form two or more different arrays of conduits that may be fluidly separate from each other, or the like.

In one or more embodiments, the interior cavity 706 may be formed by stamping and forming a single piece of material, or by coupling two or more components together to form the interior cavity 706. For example, the wall 704 including the cooling assembly 702 may be additively manufactured, and may subsequently be coupled with the other walls 704 of the electrical system 700. Optionally, the cooling assembly 702 may be additively manufactured with two or more walls 704 such that the cooling assembly 702 extends through two or more walls 704 of the electrical system 700 to direct the cooling fluid toward different heat sources of the electrical system.

As a result of exposure to thermal energy from the heat source, the cooling fluid absorbs thermal energy. In one or more embodiments, at least a portion of the cooling fluid changes phase from liquid to a vapor or gas. For example, the cooling fluid may change from a first single phase (e.g., liquid) to a second single phase (e.g., gas or vapor) or to a multiphase (e.g., liquid and gas mix). Optionally, the cooling fluid may remain in the liquid phase but the temperature of the cooling fluid may be increased relative to the temperature of the cooling fluid not exposed to the thermal energy from the heat source (e.g., the temperature of the cooling fluid flowing into the passageway 710).

In one or more embodiments, the cooling assembly 702 also includes enhancement structures (not shown), that may promote the transfer of thermal energy from the heat source (e.g., one or more components within the cavity 706 of the electrical system 700) to the cooling fluid within the cooling assembly 702. For example, the enhancement structures may be porous wick structures or lining along one or more inner surfaces of a portion of the conduits 708. Optionally, the enhancement structures may be varying fluid channel sizes of the cooling channel 708 that may be disposed at varying locations to change the turbulence of the flow of the cooling fluid, may be expanding and contracting cooling channel cross-sectional areas (e.g., expanding and/or contracting diameters of a circular cooling channel) to accommodate the production of vapor or gas phase of the cooling fluid, may be surface features, such as fins, to promote boiling or bubbling of the fluid, may be integrated swirling features to vortex the multiphase liquid and vapor mixture to separate the liquid from the vapor, or the like.

FIGS. 1 through 11 illustrate a few examples of cooling assemblies including cooling channels, cooling chambers, impingement holes or other enhancement features that may be additively manufactured within the cooling assembly. Optionally, making the thicknesses and/or sizes of the walls or other features of the cooling channels, conduits, vapor chambers, enhancement structures, or the like, have a non-uniform distribution in a body of a cooling assembly can improve the efficiency by which the cooling assembly transfers thermal energy. The non-uniform thicknesses and/or sizes can allow for cooling fluid and/or working fluid to more easily move through the three-dimensional shape of the channels, chambers, conduits, or the like, of the multi-domain cooling assembly.

In one embodiment of the subject matter described herein, a multi-domain cooling assembly configured to be coupled with one or more heat sources includes a body having an outer surface and at least one cooling chamber disposed inside the body. The at least one cooling chamber extends in at least two orthogonal dimensions and includes a working fluid to extract thermal energy from the one or more heat sources. The assembly includes a cooling channel disposed within the body and fluidly coupled with a passageway that carries cooling fluid into and out of the cooling channel. At least a portion of the cooling fluid is a liquid phase, a gas phase, or a liquid-gas mix phase. The cooling channel is fluidly separate from the at least one cooling chamber. The cooling channel is thermally coupled with the at least one cooling chamber. The at least one cooling chamber transfers thermal energy from the working fluid to the cooling fluid.

Optionally, the at least one cooling chamber is a thermal energy storage reservoir enclosed within the body of the cooling assembly. The thermal energy storage reservoir is thermally coupled with the cooling channel.

Optionally, the working fluid disposed within the thermal energy storage reservoir is a phase change material. The phase change material is configured to change between a solid phase and a liquid phase.

Optionally, the thermal energy storage reservoir includes containment walls extending around and defining the enclosed thermal energy storage reservoir.

Optionally, the cooling channel is configured to direct the cooling fluid in one or more different directions within the body of the cooling assembly.

Optionally, the at least one cooling chamber is a conformal vapor chamber enclosed within the body. The working fluid disposed within the conformal vapor chamber is a liquid phase and a gas phase of the working fluid.

Optionally, the working fluid is configured to change between the liquid phase and the gas phase of the working fluid as the conformal vapor chamber extracts thermal energy from the one or more heat sources.

Optionally, the conformal vapor chamber includes hermetic walls extending around and defining the enclosed conformal vapor chamber.

Optionally, one or more of the hermetic walls of the conformal vapor chamber is a non-planar wall.

Optionally, the cooling fluid is configured to change between a liquid phase and a gas phase as the cooling fluid extracts thermal energy from the working fluid disposed within the at least one cooling chamber.

Optionally, the outer surface of the body includes one or more surfaces. One or more of the surfaces is a non-planar surface.

Optionally, the cooling channel includes channel walls defining the cooling channel. One or more of the of the channels walls is a non-planar wall.

Optionally, the cooling channel is a first cooling channel. The cooling assembly further including a second cooling channel fluidly coupled with the first cooling channel. The first cooling channel is configured to direct the cooling fluid from the first cooling channel to the second cooling channel through one or more impingement holes.

Optionally, the first cooling channel is configured to extend in a first direction, and the second cooling channel is configured to extend in a different, second direction.

Optionally, the body includes at least two cooling chambers. A first cooling chamber is a thermal energy storage reservoir enclosed within the body of the cooling assembly, and a second cooling chamber is a conformal vapor chamber.

Optionally, the at least one cooling chamber and the cooling channel are configured to be additively manufactured within the body of the cooling assembly.

In one embodiment of the subject matter described herein, a multi-domain cooling assembly configured to be coupled with one or more heat sources includes a body having an outer surface and a cooling channel disposed inside the body and fluidly coupled with a passageway that carries cooling fluid into and out of the cooling channel. At least a portion of the cooling fluid is a liquid phase, a gas phase, or a liquid-gas mix phase. The cooling channel extending in at least two orthogonal dimensions. The assembly includes one or more of a conformal vapor chamber or a thermal energy storage reservoir. The conformal vapor chamber is enclosed within the body and holds a first working fluid inside the conformal vapor chamber. The thermal energy storage reservoir is enclosed within the body and includes a second working fluid. The one or more of the conformal vapor chamber or the thermal energy storage reservoir is configured to be thermally coupled with the cooling channel such that the one or more of the conformal vapor chamber or the thermal energy storage reservoir directs thermal energy from the one or more heat sources to the cooling channel.

Optionally, the cooling channel is configured to direct the cooling fluid in one or more different directions within the body of the cooling assembly.

Optionally, the cooling assembly includes the conformal vapor chamber and the thermal energy storage reservoir. The cooling channel, the thermal energy storage reservoir, and the conformal vapor chamber are configured to be additively manufactured within the body of the cooling assembly.

In one embodiment of the subject matter described herein, an additively manufactured body includes one or more cooling chambers enclosed inside the body. The one or more cooling chambers including one or more of a liquid phase, a gas phase, or a liquid-gas phase mixture of a working fluid inside the one or more cooling chambers. The one or more cooling chambers extending in at least two orthogonal dimensions. The body also includes a cooling channel fluidly coupled with a passageway that carries cooling fluid into and out of the cooling channel. At least a portion of the cooling fluid is a liquid phase, a gas phase, or a liquid-gas mix phase. The cooling channel extends in at least two orthogonal dimensions. The cooling channel is thermally coupled with the one or more cooling chambers. One or more of the cooling channel or the one or more cooling chambers extracts thermal energy from a heat source coupled with the additively manufactured body. The cooling channel and each of the one or more cooling chambers are fluidly separate from each other. The one or more cooling chambers and the cooling channel are configured to be additively manufactured within the body of the cooling assembly.

As used herein, an element or step recited in the singular and proceeded with the word "a" or "an" does not exclude plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The above description is illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A multi-domain cooling assembly configured to be coupled with one or more heat sources, the multi-domain cooling assembly comprising:
   a body comprising an outer surface;
   at least one cooling chamber disposed inside the body, the at least one cooling chamber comprising walls that are disposed inside the body and extend around and enclose the at least one cooling chamber entirely within the body, the least one cooling chamber extending in at least two orthogonal dimensions and including a working fluid configured to extract thermal energy from the one or more heat sources; and
   a cooling channel disposed within the body, the cooling channel being defined by channel walls that extend through the body from a first side to a second side of the body and fluidly couple the cooling channel with a passageway that is configured to carry cooling fluid into and out of the cooling channel, wherein at least a portion of the cooling fluid is configured to be a liquid phase, a gas phase, or a liquid-gas mix phase, the cooling channel further including at least one conduit extension that extends away from the channel walls of the cooling channel and toward the one or more heat sources, the at least one conduit extension being configured (i) to direct the cooling fluid from the cooling channel and toward the one or more heat sources and (ii) to direct the cooling fluid away from the one or more heat sources and toward the cooling channel,
   wherein the cooling channel is fluidly separate from the at least one cooling chamber, and
   wherein the cooling channel is thermally coupled with the at least one cooling chamber, wherein the at least one cooling chamber is configured to transfer thermal energy from the working fluid to the cooling fluid.

2. The multi-domain cooling assembly of claim 1, wherein the at least one cooling chamber is a thermal energy storage reservoir enclosed within the body of the cooling assembly, wherein the thermal energy storage reservoir is thermally coupled with the cooling channel.

3. The multi-domain cooling assembly of claim 2, wherein the working fluid disposed within the thermal energy storage reservoir is a phase change material, wherein the phase change material is configured to change between a solid phase and a liquid phase.

4. The multi-domain cooling assembly of claim 1, wherein the cooling channel is configured to direct the cooling fluid in one or more different directions within the body of the cooling assembly.

5. The multi-domain cooling assembly of claim 1, wherein the at least one cooling chamber is a conformal vapor chamber enclosed within the body, wherein the working fluid disposed within the conformal vapor chamber is a liquid phase and a gas phase of the working fluid.

6. The multi-domain cooling assembly of claim 5, wherein the working fluid is configured to change between the liquid phase and the gas phase of the working fluid as the conformal vapor chamber extracts thermal energy from the one or more heat sources.

7. The multi-domain cooling assembly of claim 5, wherein the walls of the conformal vapor chamber comprise hermetic walls extending around and defining the enclosed conformal vapor chamber.

8. The multi-domain cooling assembly of claim 7, wherein one or more of the hermetic walls of the conformal vapor chamber is a non-planar wall.

9. The multi-domain cooling assembly of claim 1, wherein the cooling fluid is configured to change between a liquid phase and a gas phase as the cooling fluid extracts thermal energy from the working fluid disposed within the at least one cooling chamber.

10. The multi-domain cooling assembly of claim 1, wherein the outer surface of the body comprises one or more surfaces, wherein one or more of the surfaces is a non-planar surface.

11. The multi-domain cooling assembly of claim 1, wherein one or more of the channel walls is a non-planar wall.

12. The multi-domain cooling assembly of claim 1, wherein the cooling channel is a first cooling channel, the cooling assembly further comprising a second cooling channel fluidly coupled with the first cooling channel, wherein the first cooling channel is configured to direct the cooling fluid from the first cooling channel to the second cooling channel through one or more impingement holes.

13. The multi-domain cooling assembly of claim 12, wherein the first cooling channel is configured to extend in a first direction, and the second cooling channel is configured to extend in a different, second direction.

14. The multi-domain cooling assembly of claim 1, wherein the body includes at least two cooling chambers, wherein a first cooling chamber is a thermal energy storage reservoir enclosed within the body of the cooling assembly, and a second cooling chamber is a conformal vapor chamber.

15. The multi-domain cooling assembly of claim 1, wherein the at least one cooling chamber and the cooling channel are configured to be additively manufactured within the body of the cooling assembly.

16. A multi-domain cooling assembly configured to be coupled with one or more heat sources, the cooling assembly comprising:
a body comprising an outer surface;
a cooling channel disposed inside the body, the cooling channel being defined by channel walls that extend through the body from a first side to a second side of the body and fluidly couple the cooling channel with a passageway that is configured to carry cooling fluid into and out of the cooling channel, wherein at least a portion of the cooling fluid is configured to be a liquid phase, a gas phase, or a liquid-gas mix phase, the cooling channel extending in at least two orthogonal dimensions, and the cooling channel further including at least one conduit extension that extends away from the channel walls of the cooling channel and toward the one or more heat sources, the at least one conduit extension being configured (i) to direct the cooling fluid from the cooling channel and toward the one or more heat sources and (ii) to direct the cooling fluid away from the one or more heat sources and toward the cooling channel;
one or more of (i) a conformal vapor chamber that is disposed within the body and configured to hold a first working fluid inside the conformal vapor chamber, the conformal vapor chamber comprising walls that are disposed inside the body and extend around and enclose the conformal vapor chamber entirely within the body; and (ii) a thermal energy storage reservoir that is disposed within the body and includes a second working fluid, the thermal energy storage reservoir comprising walls that are disposed inside the body and extend around and enclose the thermal energy storage reservoir entirely within the body,
wherein the one or more of the conformal vapor chamber and the thermal energy storage reservoir is configured to be thermally coupled with the cooling channel such that the one or more of the conformal vapor chamber and the thermal energy storage reservoir directs thermal energy from the one or more heat sources to the cooling channel.

17. The cooling assembly of claim 16, wherein the cooling channel is configured to direct the cooling fluid in one or more different directions within the body of the cooling assembly.

18. The cooling assembly of claim 16, wherein the cooling assembly includes the conformal vapor chamber and the thermal energy storage reservoir, wherein the cooling channel, the thermal energy storage reservoir, and the conformal vapor chamber are configured to be additively manufactured within the body of the cooling assembly.

19. An additively manufactured body comprising:
one or more cooling chambers disposed inside the body, the one or more cooling chambers comprising walls that are disposed inside the body and extend around and enclose the one or more cooling chambers entirely within the body, the one or more cooling chambers including one or more of a liquid phase, a gas phase, or a liquid-gas phase mixture of a working fluid inside the one or more cooling chambers, the one or more cooling chambers extending in at least two orthogonal dimensions; and
a cooling channel disposed within the body, the cooling channel being defined by channel walls that extend through the body from a first side to a second side of the body and fluidly couple the cooling channel with a passageway that is configured to carry cooling fluid into and out of the cooling channel, wherein at least a portion of the cooling fluid is configured to be a liquid phase, a gas phase, or a liquid-gas mix phase, the cooling channel extending in at least two orthogonal dimensions, and the cooling channel further including at least one conduit extension that extends away from the channel walls of the cooling channel and toward one or more heat sources, the at least one conduit extension being configured (i) to direct the cooling fluid from the cooling channel and toward the one or more heat sources and (ii) to direct the cooling fluid away from the one or more heat sources and toward the cooling channel, wherein the cooling channel is thermally coupled with the one or more cooling chambers, wherein one or more of the cooling channel or the one or more cooling chambers are configured to extract thermal energy from a heat source coupled with the additively manufactured body, wherein the cooling channel and each of the one or more cooling chambers are fluidly separate from each other, and wherein the one or more cooling chambers and the cooling channel are configured to be additively manufactured within the body.

* * * * *